(12) United States Patent
Chang

(10) Patent No.: US 8,994,431 B2
(45) Date of Patent: Mar. 31, 2015

(54) FLIP-FLOP CIRCUIT HAVING SET/RESET CIRCUIT

(71) Applicant: Silicon Motion Inc., Hsinchu County (TW)

(72) Inventor: Hui-Ju Chang, Kaohsiung (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 0 days.

(21) Appl. No.: 13/925,815

(22) Filed: Jun. 24, 2013

(65) Prior Publication Data

US 2014/0002159 A1 Jan. 2, 2014

Related U.S. Application Data

(60) Provisional application No. 61/665,321, filed on Jun. 28, 2012.

(30) Foreign Application Priority Data

Feb. 4, 2013 (TW) .............................. 102104232 A

(51) Int. Cl.
*H03K 3/00* (2006.01)
*H03K 3/013* (2006.01)
*H03K 3/356* (2006.01)

(52) U.S. Cl.
CPC .......... *H03K 3/013* (2013.01); *H03K 3/356191* (2013.01)

USPC ......................................................... 327/218

(58) Field of Classification Search
USPC .................................................. 327/199–225
See application file for complete search history.

(56) References Cited

U.S. PATENT DOCUMENTS

| 7,109,772 B2 * | 9/2006 | Tohsche ...................... 327/218 |
| 7,212,056 B1 * | 5/2007 | Belov ......................... 327/210 |
| 2009/0212833 A1 * | 8/2009 | Mitsuishi .................... 327/115 |

* cited by examiner

*Primary Examiner* — Sibin Chen
(74) *Attorney, Agent, or Firm* — Winston Hsu; Scott Margo

(57) ABSTRACT

A flip-flop circuit includes an input stage circuit, a middle stage circuit, an output stage circuit and a set/reset circuit. The input stage circuit is arranged for receiving a first signal from a first node, and selectively outputting a second signal at a second node according to at least one control signal. The middle stage circuit is coupled to the input stage circuit, and arranged for receiving the second signal, and selectively outputting a third signal at a third node according to the at least one control signal. The output stage circuit is coupled to the middle stage circuit, and arranged for receiving the third signal to output an output signal. The set/reset circuit is coupled to the second node and the third node, and arranged to receiving a set signal and a reset signal, and selectively determining a voltage level of the third signal at the third node.

7 Claims, 4 Drawing Sheets

FLIP-FLOP CIRCUIT HAVING SET/RESET CIRCUIT

CROSS REFERENCE TO RELATED APPLICATIONS

This application claims the benefit of U.S. provisional application No. 61/665,321, filed on Jun. 28, 2012 and incorporated herein by reference.

BACKGROUND OF THE INVENTION

1. Field of the Invention

The disclosed embodiments of the present invention relates to a flip-flop circuit design, and more particularly, to a flip-flop circuit with a circuit structure similar to a true single phase clock (TSPC) structure and having a set/reset function.

2. Description of the Prior Art

In a high-speed phase-locked loop (PLL) circuit, the frequency divider would perform frequency division operation on high-frequency (e.g., above 1 GHz) signals. However, if advanced manufacture processes are unavailable, it is not feasible for a flip-flop used in the frequency divider to be realized by a standard D-type flip-flop element.

In order to solve the above-mentioned problem, the frequency divider may be realized by using a TSPC flip-flop. The TSPC flip-flop may be used in a high-speed circuit. However, the TSPC flip-flop is only allowed to use a single-phase trigger clock in order to avoid clock signals with different phases from concurrently pulling internal data to a high electric potential and a low electric potential, and thus fails to have a set/reset function.

In addition, in a spread spectrum clock (SSC) PLL circuit that may mitigate an electromagnetic interference (EMI), a divisor of the frequency divider has to constantly change in order to spread the spectrum, and the larger is the divisor of the frequency divider, the better the effect of the spread spectrum is. Therefore, how to design a frequency divider that may be employed in high-speed operations as well as a flip-flop circuit having a set/reset function is an important issue.

SUMMARY OF THE INVENTION

In accordance with exemplary embodiments of the present invention, a flip-flop circuit capable of being employed in a high-speed frequency divider and having a set/reset function is proposed to solve the above-mentioned problem.

According to an aspect of the present invention, an exemplary flip-flop circuit is disclosed. The exemplary flip-flop circuit includes an input stage circuit, a middle stage circuit, an output stage circuit and a set/reset circuit. The input stage circuit is arranged for receiving a first signal from a first node, and selectively outputting a second signal corresponding to the first signal at a second node according to at least one control signal. The middle stage circuit is coupled to the input stage circuit, and arranged for receiving the second signal, and selectively outputting a third signal corresponding to the second signal at a third node according to the at least a control signal. The output stage circuit is coupled to the middle stage circuit, and arranged for receiving the third signal to output an output signal. The set/reset circuit is coupled to the second node and the third node, and arranged to receiving a set signal and a reset signal, and selectively determining a voltage level of the third signal at the third node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
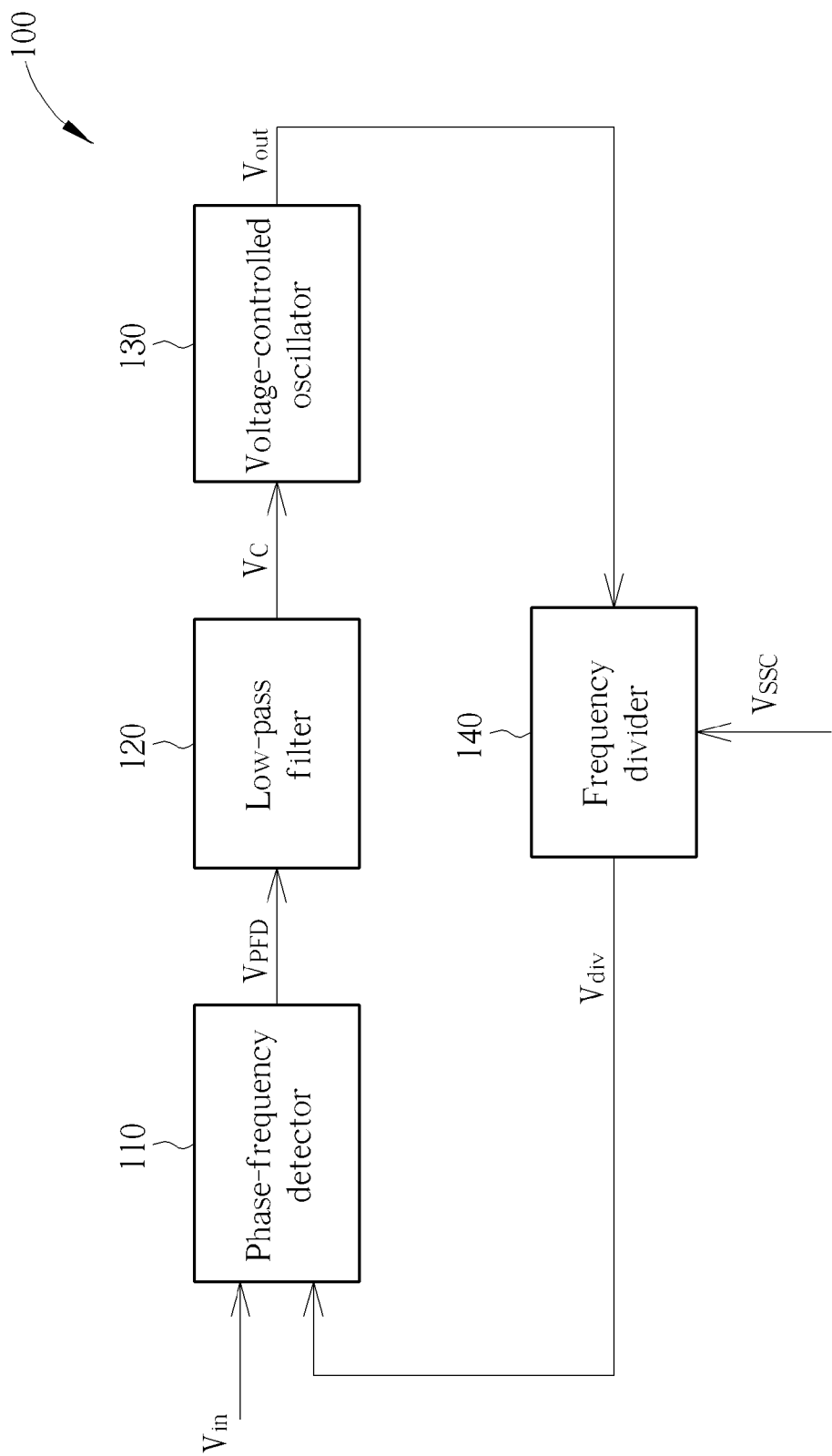
FIG. 1 is a schematic diagram illustrating a phase-locked loop according to an embodiment of the present invention.

Please refer to FIG. 1, which is a schematic diagram illustrating a phase-locked loop 100 according to an embodiment of the present invention. As shown in FIG. 1, the phase-locked loop 100 includes a phase-frequency detector 110, a low-pass filter 120, a voltage-controlled oscillator 130 and a frequency divider 140. The phase-locked loop 100 is a high-speed phase-locked loop circuit, and an output clock $V_{out}$ generated by the phase-locked loop 100 has a frequency higher than 1 GHz. Besides, in this embodiment, the phase-locked loop 100 is a spread spectrum clock phase-locked loop circuit.

Regarding operations of the phase-locked loop 100, the phase-frequency detector 110 first compares an input signal $V_{in}$ with a feedback signal (i.e., a frequency-divided signal $V_{div}$ outputted by frequency divider 140) to generate a detecting result $V_{PFD}$, and then the low-pass filter 120 processes the detecting result $V_{PFD}$ to generate a control signal $V_C$; next, the voltage-controlled oscillator 130 generates the output clock $V_{out}$ according to the control signal $V_C$; finally, the frequency divider 140 adjusts its divisor according to a spread spectrum clock control signal $V_{SSC}$, so as to perform frequency-division operation on the output clock $V_{out}$ to generate the frequency-divided signal $V_{div}$.

In this embodiment, the phase-locked loop 100 has only one frequency divider 140, and the frequency divider 140 has a large divisor. For example, assuming the frequency of the output clock $V_{out}$ is 3 GHz, the frequency of the input signal $V_{in}$ is 25 MHz, and the divisor of the frequency divider 140 is 120. In addition, the frequency divider 140 controls its divisor to constantly change around the value of 120 according to the spread spectrum clock control signal $V_{SSC}$, so as to achieve the goal of spreading the spectrum.

In practice, the frequency divider 140 would include multiple flip-flop circuits and/or other related circuits. Since those skilled in the arts should be familiar with the art of using flip-flops to realize the frequency divider 140, detailed description is omitted for brevity. The following will illustrate the circuit structure of a flip-flop used in the frequency divider 140.

Figure 2:
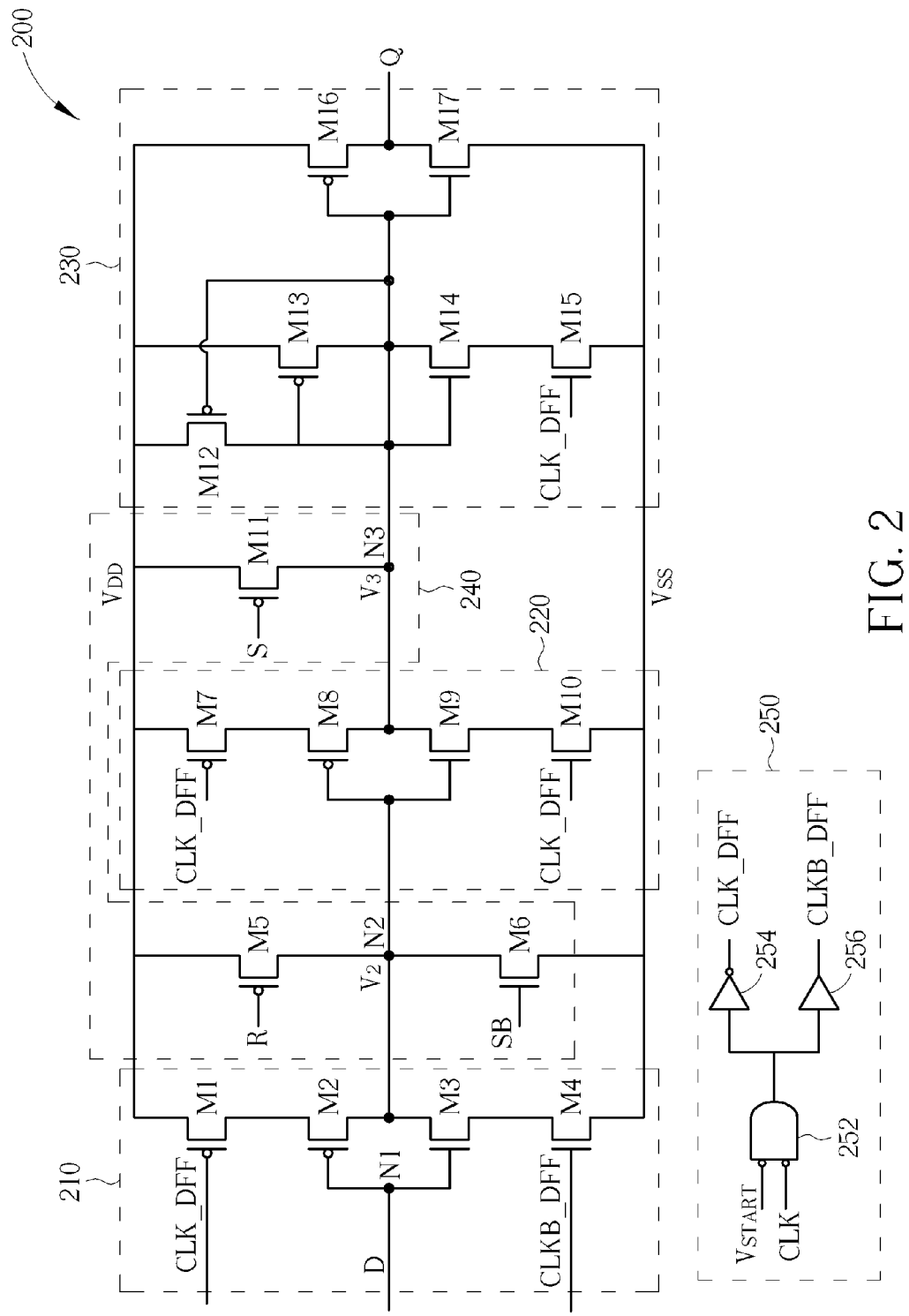
FIG. 2 is a schematic diagram illustrating a flip-flop circuit according to an embodiment of the present invention.

Please refer to FIG. 2, which is a schematic diagram illustrating a flip-flop circuit 200 according to an embodiment of the present invention. As shown in FIG. 2, the flip-flop circuit 200 is coupled to two supply voltages $V_{DD}$ and $V_{SS}$, and includes an input stage circuit 210, a middle stage circuit 220, an output stage circuit 230, a set/reset circuit 240 and a control circuit 250. The input stage circuit 210 include an inverter (composed of transistors M2 and M3) and two switches (i.e., transistors M1 and M4), the middle stage circuit 220 includes an inverter (composed of transistors M8 and M9) and two switches (i.e., transistor M7 and M10), the output stage circuit 230 includes transistors M12-M17, the set/reset circuit 240 includes transistors M5, M6 and M11, and the control circuit 250 includes a logic gate 252, an inverter 254 and a buffer 256. The connections between internal elements of the flip-flop circuit 200 may be referred to FIG. 2, and thus is not detailed here.

The flip-flop circuit 200 may operate in two different operational modes, i.e., a first mode and a second mode, and the flip-flop circuit 200 determines which mode to enter by referring to a start signal $V_{START}$ received by the control circuit 250. In the embodiment shown in FIG. 2 and the following description, when the start signal $V_{START}$ is "1", the flip-flop circuit 200 operates in the first mode, such that the flip-flop circuit 200 determines an output signal Q according to a set signal S, a reset signal R and an inverted signal SB of the set signal S; in addition, when the start signal $V_{START}$ is "0", the flip-flop circuit 200 operates in the second mode to act as a D flip-flop used to generate the output signal Q according to a first signal (data signal) D. The following will provide details of the flip-flop circuit 200 operating in the first mode and the second mode, respectively.

Figure 3:
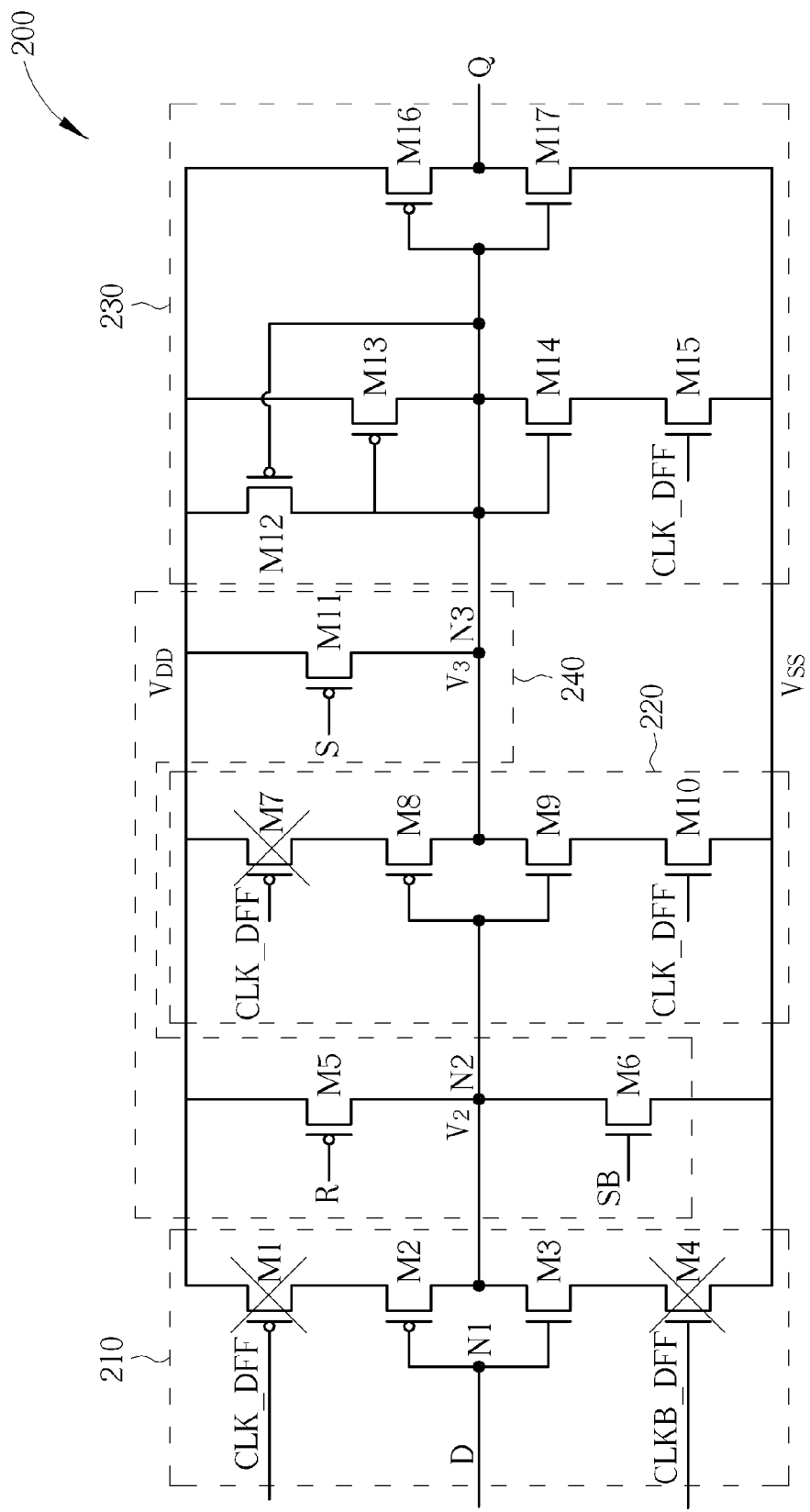
FIG. 3 is a schematic diagram illustrating the flip-flop circuit in FIG. 2 operating in the first mode.

Please concurrently refer to FIG. 2 and FIG. 3. FIG. 3 is a schematic diagram illustrating the flip-flop circuit 200 operating in the first mode. When the flip-flop circuit 200 operates in the first mode, the start signal $V_{START}$ is "1", and an output of the logic gate 252 is always "0", such that two control signals CLK_DFF and CLKB_DFF outputted from the control circuit 250 are "1" and "0", respectively.

Since the control signal CLK_DFF and CLKB_DFF are "1" and "0", respectively, the transistors M1, M4 and M7 as shown in FIG. 3 are all switched off (non-conductive), and the transistors M10 and M15 are switched on (conductive), where each of the turn-off switches (transistors) is marked with "X" in FIG. 3. Since the transistors M1 and M4 in the input stage circuit 210 are all switched off, the inverter (M2 and M3) in the first stage circuit 210 cannot invert the first signal D. That is, the input stage circuit 210 disconnects a first node N1 from a second node N2. At this moment, the output signal Q of the flip-flop circuit 200 may be determined entirely by the set signal S, the reset signal R and the inverted signal SB, without being affected by the first signal D. In detail, when the set signal S, the reset signal R and the inverted signal SB are "1", "0", "0", respectively, the transistors M6 and M11 are both switched off, and the transistor M5 is switched on. Hence, at this moment, a second signal $V_2$ at the second node N2 is "1". The inverter (M8 and M9) in the middle stage circuit 220 then inverts the second signal $V_2$, so as to output a third signal $V_3$ (digital value "0") to a third node N3, and the output stage circuit 230 receives the third signal $V_3$ to generate the output signal Q. In addition, when the set signal S, the reset signal R and the inverted signal SB are "0", "1", "1", respectively, the transistors M6 and M11 are both switched on, and the transistor M5 is switched off. Hence, at this moment, the second signal $V_2$ at the second node N2 is "0". Since the transistor M7 is switched off, the middle stage circuit 220 would not generate the third signal $V_3$. Regarding the third signal $V_3$, it would have a digital value "1" due to the transistor M11 which is conductive now. Next, the output stage circuit 230 receives the third signal $V_3$ and accordingly generates the output signal Q.

The following table simply explains each signal's logic value when the flip-flop circuit 200 operates in the first mode.

TABLE 1

| $V_{START}$ | CLK | CLK_DFF | CLKB_DFF | D | R | S | SB | Q |
|---|---|---|---|---|---|---|---|---|
| 1 | X | 1 | 0 | X | 0 | 1 | 0 | 0 |
| 1 | X | 1 | 0 | X | 1 | 0 | 1 | 1 |

As mentioned above, when the flip-flop circuit 200 operates in the first mode, the control circuit 250 generates the control signals CLK_DFF and CLKB_DFF to block the first signal D, such that the second signal $V_2$ at the second node N2 would not be affected by the first signal D, even if there is a skew between the control signals CLK_DFF and CLK-B_DFF. The second signal $V_2$ at the second node N2 will only be affected by the first signal D very shortly and thus can be treated as having a temporary glitch. Besides, since the set signal S and the reset signal R are stable, the second signal $V_2$ at second node N2 will be restored to the normal state immediately after the skew between the control signal CLK_DFF and CLKB_DFF disappears.

Figure 4:
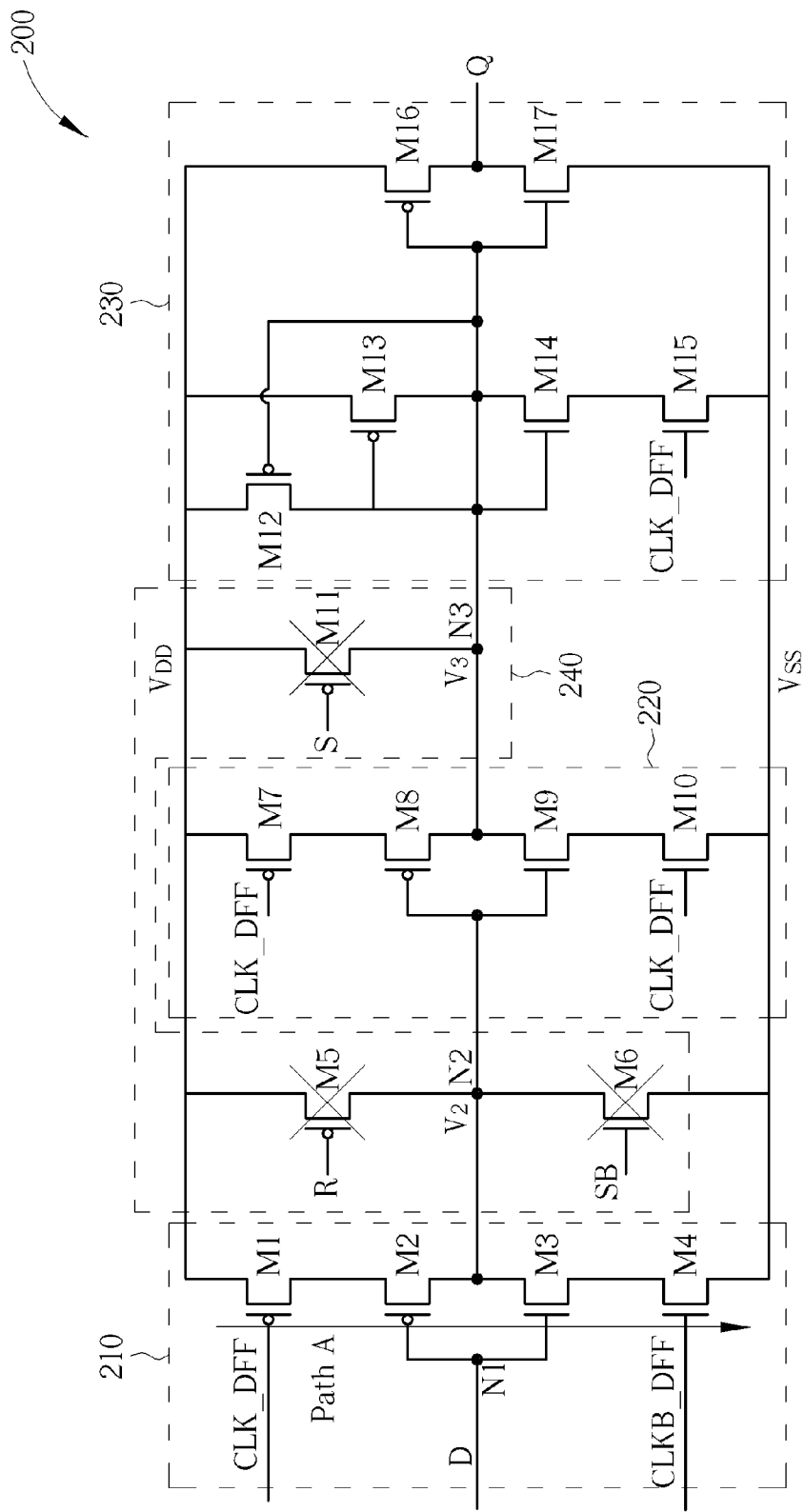
FIG. 4 is a schematic diagram illustrating the flip-flop circuit in FIG. 2 operating in the second mode.

Please concurrently refer to FIG. 2 and FIG. 4. FIG. 4 is a schematic diagram illustrating the flip-flop circuit 200 operating in the second mode. When the flip-flop circuit 200 operates in the second mode, the start signal $V_{START}$ is "0", and thus the output of the logic gate 252 is equal to the inverted signal of the clock signal CLK. Therefore, the control signal CLK_DFF outputted by the control circuit 250 is substantially equal to the clock signal CLK (with a certain delay), and the control signal CLKB_DFF is substantially equal to the inverted signal of the clock signal CLK (with a certain delay). In addition, the set signal S, the reset signal R and the inverted signal SB would be set to "1", "1", "0", respectively, such that the transistors M5, M6 and M11 would be at the turn-off state, where each of the turn-off switches (transistors) is marked with "X" in FIG. 4.

When the flip-flop circuit 200 operates in the second mode, the operations of the flip-flop circuit 200 are substantially equal to that of a D-type flip-flop. In detail, assume that when D=0 and CLK_DFF=0, the input stage circuit 210 receives data (at this moment, the second signal $V_2$ is equal to "1"), and when CLK_DFF=1, the output stage circuit 230 outputs data (i.e., the middle stage circuit 220 inverts the second signal $V_2$ to generate the third signal $V_3$, and then the output stage circuit 230 generates the output signal Q according to the third signal $V_3$). Since the transistor M3 is switched off when D=0, a path A as shown in FIG. 4 would never be conductive, even if there is a skew between the control signals CLK_DFF and CLKB_DFF. Hence, the second signal $V_2$ and the output signal Q are not affected. On the other hand, assume that when D=1, CLK_DFF=0 and CLKB_DFF=1, the input stage circuit 210 receives data (at this moment, the second signal $V_2$ is equal to "0" and the third signal $V_3$ is equal to "1"), and when CLK_DFF=1, the output stage circuit 230 outputs data (i.e. the output stage circuit 230 generates the output signal Q according to the third signal $V_3$). Since the transistor M2 is switched off when D=1, the path A as shown in FIG. 4 would never be conductive, even if there is a skew between the control signals CLK_DFF and CLKB_DFF. Hence, the second signal $V_2$ and the output signal Q will not be affected.

The following table simply explains each signal's logic value when the flip-flop circuit 200 operates in the second mode.

TABLE 2

| $V_{START}$ | CLK | CLK_DFF | CLKB_DFF | D | R | S | SB | Q |
|---|---|---|---|---|---|---|---|---|
| 0 | 1 | 1 | 0 | 1 | 1 | 1 | 0 | 1 |
| 0 | 1 | 1 | 0 | 0 | 1 | 1 | 0 | 0 |

As mentioned above, when the flip-flop circuit 200 operates in the second mode, the operations of the flip-flop circuit 200 are substantially equal to that of a D-type flip-flop. Besides, since switches/transistors on the path A will never be concurrently turned on, the voltage level of the output signal Q will not be affected even if there is a skew between the control signals CLK_DFF and CLKB_DFF.

In addition, please note that the circuit structure of the control unit 250 as shown in FIG. 2 is for illustrative purpose only, and not meant to be a limitation of the present invention. As long as the control signals CLK_DFF and CLKB_DFF are equal to "1" and "0" respectively when flip-flop circuit 200 operates in the first mode, and the control signal CLK_DFF is substantially equal to the clock signal CLK and the control signal CLKB_DFF is substantially equal to an inverted signal of the clock signal CLK when the flip-flop circuit 200 operates in the second mode, those skilled in the art should readily understand how to generate the control signals CLK_DFF and CLKB_DFF by using different logic circuits under the above-mentioned criteria. These alternative designs should also belong to the scope of the present invention.

In addition, the circuit structures in the input stage circuit 210, the middle stage circuit 220, the output stage circuit 230 and the set/reset circuit 240 as shown in FIG. 2 are for illustrative purpose only, and not meant to be limitations of the present invention. After reading the above-mentioned descriptions, those skilled in the arts should readily understand that the circuit structures as shown in FIG. 2 may be modified as long as the input stage circuit 210 disconnects the first node N1 from the second node N2 (i.e., the first signal D would not affect the second signal $V_2$) and the output signal Q is generated according to the set signal S and the reset signal R when the flip-flop circuit 200 operates in the first mode, and the flip-flop circuit 200 acts as a D-type flip-flop, and the path A as shown in FIG. 4 would never be conductive when the flip-flop circuit 200 operates in the second mode. These alternative designs should also belong to the scope of the present invention.

To conclude the present invention, the flip-flop circuit of the present invention may operate in two different modes, wherein the first mode may allow the flip-flop circuit to have the set/reset function, and the second mode may use the flip-flop circuit as a D-type flip-flop; In addition, the flip-flop circuit of the present invention is controlled by two clock signals having different phases (i.e., the control signals CLK_DFF and CLKB_DFF as shown in FIG. 2), and no matter whether these two clock signals have phase shift, the output signal of the flip-flop circuit would not be affected. Therefore, the flip-flop circuit of the present invention may be employed in a frequency divider of a high-speed spread spectrum clock phase-locked loop circuit, thus making the frequency divider have great performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip-flop circuit, comprising:
    an input stage circuit, arranged for receiving a first signal from a first node, and selectively outputting a second signal corresponding to the first signal at a second node according to at least one control signal;
    a middle stage circuit, coupled to the input stage circuit, arranged for receiving the second signal, and selectively outputting a third signal corresponding to the second signal at a third node according to the at least one control signal;
    an output stage circuit, coupled to the middle stage circuit, arranged for receiving the third signal to output an output signal; and
    a set/reset circuit, coupled to the second node and the third node, arranged for receiving a set signal and a reset signal, and selectively determining a voltage level of the third signal at the third node;
    wherein the flip-flop circuit selectively operates in a first mode or a second mode according to the at least one control signal, when the flip-flop circuit operates in the first mode, the input stage circuit disconnects the first node from the second node, and the set/reset circuit determines the voltage level of the third signal according to the set signal and the reset signal; when the flip-flop circuit operates in the second mode , the set/reset circuit is disabled, and the input stage circuit generates the second signal according to the first signal, and the middle stage circuit generates the third signal according to the second signal; and
    the input stage circuit comprises:
        an inverter, wherein the first node and the second node are an input node and an output node of the inverter, respectively;
        a first switch, coupled between the flip-flop and a first supply voltage, arranged for selectively coupling the inverter to the first supply voltage according to the at least one control signal; and
        a second switch, coupled between the inverter and a second supply voltage, arranged for selectively coupling the inverter to the second supply voltage according to the at least one control signal; and
    the flip-flop circuit further comprises:
        a control circuit, arranged for receiving a start signal and a clock signal, and accordingly generating the at least one control signal, wherein the start signal is used to indicate whether the flip-flop circuit currently operates in the first mode or the second mode.

2. The flip-flop circuit of claim 1, wherein when the flip-flop circuit operates in the first mode, the control circuit generates the at least one control signal to switch off the first switch and the second switch to disconnect the first node from the second node; and when the flip-flop circuit operates in the second mode, the at least one control signal is substantially equal to the clock signal.

3. The flip-flop circuit of claim 1, wherein the flip-flop circuit is employed in a frequency divider.

4. A flip-flop circuit, comprising:
    an input stage circuit, arranged for receiving a first signal from a first node, and selectively outputting a second signal corresponding to the first signal at a second node according to at least one control signal;
    a middle stage circuit, coupled to the input stage circuit, arranged for receiving the second signal, and selectively outputting a third signal corresponding to the second signal at a third node according to the at least one control signal;

an output stage circuit, coupled to the middle stage circuit, arranged for receiving the third signal to output an output signal; and a set/reset circuit, coupled to the second node and the third node, arranged for receiving a set signal and a reset signal, and selectively determining a voltage level of the third signal at the third node;

wherein the flip-flop circuit selectively operates in a first mode or a second mode according to the at least one control signal, when the flip-flop circuit operates in the first mode, the input stage circuit disconnects the first node from the second node, and the set/reset circuit determines the voltage level of the third signal according to the set signal and the reset signal; when the flip-flop circuit operates in the second mode, the set/reset circuit is disabled, and the input stage circuit generates the second signal according to the first signal, and the middle stage circuit generates the third signal according to the second signal; and the middle stage circuit comprises:
- an inverter, wherein the second node and the third node are an input node and an output node of the inverter, respectively;
- a first switch, coupled between the inverter and a first supply voltage, arranged for selectively coupling the inverter to the first supply voltage according to the at least one control signal; and
- a second switch, coupled between the inverter and a second supply voltage, arranged for selectively coupling the inverter to the second supply voltage according to the at least one control signal; and the flip-flop circuit further comprises:

a control circuit, arranged for receiving a start signal and a clock signal, and accordingly generating the at least one control signal, wherein the start signal is used to indicate whether the flip-flop circuit currently operates in the first mode or the second mode.

5. The flip-flop circuit of claim 4, wherein when the flip-flop circuit operates in the first mode, the control circuit generates the at least one control signal to switch off the first switch and to switch on the second switch; and when the flip-flop circuit operates in the second mode, the at least one control signal is substantially equals to the clock signal.

6. A flip-flop circuit, comprising:
an input stage circuit, arranged for receiving a first signal from a first node, and selectively outputting a second signal corresponding to the first signal at a second node according to at least one control signal;

a middle stage circuit, coupled to the input stage circuit, arranged for receiving the second signal, and selectively outputting a third signal corresponding to the second signal at a third node according to the at least one control signal;

an output stage circuit, coupled to the middle stage circuit, arranged for receiving the third signal to output an output signal; and a set/reset circuit, coupled to the second node and the third node, arranged for receiving a set signal and a reset signal, and selectively determining a voltage level of the third signal at the third node;

wherein the flip-flop circuit selectively operates in a first mode or a second mode according to the at least one control signal, when the flip-flop circuit operates in the first mode, the input stage circuit disconnects the first node from the second node, and the set/reset circuit determines the voltage level of the third signal according to the set signal and the reset signal; when the flip-flop circuit operates in the second mode, the set/reset circuit is disabled, and the input stage circuit generates the second signal according to the first signal, and the middle stage circuit generates the third signal according to the second signal;

wherein the set/reset circuit comprises:
- a first switch, coupled between the third node and a first supply voltage, arranged for selectively coupling the third node to the first supply voltage according to the set signal;
- a second switch, coupled between the second node and the first supply voltage, arranged for selectively coupling the second node to the first supply voltage according to the reset signal; and
- a third switch, coupled between the second node and a second supply voltage, arranged for selectively coupling the second node to the second supply voltage according to an inverted signal of the set signal.

7. The flip-flop circuit of claim 6, wherein when the flip-flop circuit operates in the first mode, the first, second, and third switch determine the voltage level of the third signal at the third node via the set signal, the reset signal and the inverted signal of the set signal, respectively; and when the flip-flop circuit operates in the second mode, the first, second, and third switch are all switched off.

* * * * *